United States Patent
Magerlein et al.

(10) Patent No.: US 6,747,472 B2
(45) Date of Patent: Jun. 8, 2004

(54) TEMPORARY DEVICE ATTACH STRUCTURE FOR TEST AND BURN IN OF MICROJOINT INTERCONNECTS AND METHOD FOR FABRICATING THE SAME

(75) Inventors: John Harold Magerlein, Yorktown Heights, NY (US); Samuel Roy McKnight, New Paltz, NY (US); Kevin Shawn Petrarca, Newburgh, NY (US); Sampath Purushothaman, Yorktown Heights, NY (US); Carlos Juan Sambucetti, Croton-on-Hudson, NY (US); Joseph J. Van Horn, Underhill, VT (US); Richard Paul Volant, New Fairfield, CT (US); George Frederick Walker, New York, NY (US)

(73) Assignee: International Business Machines Corporation, Armonk, NY (US)

( * ) Notice: Subject to any disclaimer, the term of this patent is extended or adjusted under 35 U.S.C. 154(b) by 181 days.

(21) Appl. No.: 10/052,619

(22) Filed: Jan. 18, 2002

(65) Prior Publication Data

US 2003/0136813 A1 Jul. 24, 2003

(51) Int. Cl.⁷ .......................... G01R 31/26; H01L 21/66
(52) U.S. Cl. ......................................... 324/765; 438/17
(58) Field of Search .............................. 438/17; 324/765

(56) References Cited

U.S. PATENT DOCUMENTS

| | | | | |
|---|---|---|---|---|
| 5,137,461 A | * | 8/1992 | Bindra et al. | 439/74 |
| 5,420,520 A | * | 5/1995 | Anschel et al. | 324/754 |
| 6,339,024 B1 | | 1/2002 | Petrarca et al. | 438/686 |
| 6,344,125 B1 | | 2/2002 | Locke et al. | 205/118 |
| 6,368,484 B1 | | 4/2002 | Volant et al. | 205/220 |
| 6,414,509 B1 | * | 7/2002 | Bhatt et al. | 324/765 |

OTHER PUBLICATIONS

Richard Volant, Kevin Petrarca, Peter Locke, James A. Tornello and Donald F. Canaperi, Tittle: "*Replated Metal Structures for Semiconductor Devices*", U.S. patent application Ser. No. 09/657,469, filed on May 9, 2000.

* cited by examiner

Primary Examiner—Evan Pert
(74) Attorney, Agent, or Firm—Ohlandt, Greeley, Ruggiero & Perle, L.L.P.

(57) ABSTRACT

A system for testing a collection of device chips by temporarily attaching them to a carrier having a plurality of receptacles with microdendritic features; the receptacles matching with and pushed in contact with a matching set of contact pads on the device chips; said carrier additionally having test pads connected to the receptacles through interconnect wiring. The system allows connecting the chips together and testing the collection as a whole by probing the test pads on the carrier. Burn-in of the collection of chips can also be performed on the temporary carrier, which is reusable.

22 Claims, 3 Drawing Sheets

TEMPORARY DEVICE ATTACH STRUCTURE FOR TEST AND BURN IN OF MICROJOINT INTERCONNECTS AND METHOD FOR FABRICATING THE SAME

FIELD OF THE INVENTION

This invention pertains to the field of microelectronics and, more particularly, to the field of fabricating and interconnecting extremely small semi-conductor devices commonly referred to as "chips."

RELATED INVENTIONS

The present invention is related to certain inventions assigned to the assignee of the present invention. These are in co-pending applications YOR920010217US1 and 20010216US1, the disclosures of which are cross-referenced and incorporated herein.

BACKGROUND OF THE INVENTION

Increased levels of integration in the silicon transistor technology over the last two decades have facilitated the migration from large scale integrated (LSI) to very large scale integrated (VLSI) and now to ultra-large scale integrated (ULSI) circuits for use in silicon chips for computing, communication and micro controller applications. Optimum utilization of these highly integrated silicon chips requires a more space efficient packaging with supporting devices such as memory chips. Further, with the advent of mobile communication devices, hand held organizers and computing devices, there has also been a push to integrate such varied functions into a single compact system. This in turn has led to the push in the microelectronics industry towards system-on-a-chip (SOC) approach.

Simply stated, the SOC approach attempts to integrate as many of these different device functionalities on the same silicon chip so that a single large chip can provide a variety of functions to the end user. Although conceptually very attractive such an approach is practically daunting due to several reasons. First, the materials, fabrication processes and feature sizes optimum for the different microelectronic devices (such as memory chips, logic chips, wireless communication chips, etc.) are quite different from each other. Combining them all onto the same chip implies making compromises that can limit the performance achievable in each of the device blocks in the SOC. Second, integration of a large number of functional blocks requires a large chip size with many levels of wiring constructed on the chip. Both these factors tend to reduce the yield and increase the cost per chip, which is undesirable. Third, one has to design and build every unique combination of functions (e.g., memory and microprocessor, wireless communication and microprocessor, etc.) leading to a large variety of chip part numbers and product mix that is not conducive to low cost reduced manufacturing. Last, the expertise required for combining a diverse set of materials, process and integration schemes on a single SOC is often not available in a single enterprise as these are currently part of different microelectronic businesses.

An attractive alternative to SOC is system-on-a-package or SOP wherein a number of chips, each optimized for its unique function and perhaps manufactured in different factories specially tailored to produce the specific chips are combined on a first level packaging carrier that interconnects them and allows the resulting package to function as a single system. The level of interconnection and input-output-(I/O) density required in such a package is expected to be far greater than those currently available in printed circuit board or multilayer ceramic technologies. Since this SOP carrier with chips assembled on it is expected to replace an SOC, it is reasonable to expect that the interconnect and I/O densities should be somewhere between those used in the far back end of the line (FBEOL) interconnect levels on chips (typically wiring and vias on 500 nm to 1000 nm pitch) and the most aggressive packaging substrates (typically vias and wiring on 10,000 to 20,000 nm pitch). Extension of the FBEOL processes at the required wiring size and pitch for the SOP carrier is feasible if the carrier itself is made of silicon. In addition, however, the carrier would be required to support a high I/O density in order to interconnect the various device chips mounted on it. Greater the granularity of the system, that is, finer the division of the system into sub-units or chips, greater will be the number of I/Os required. It is expected that such I/O densities will necessitate bonding pads that are on the order of 5 to 10 $\mu$m size and spaces which are presently outside the realm of possibility of typical packaging I/O pads which are at least 10 to 20 times coarser in size and spacing.

It is therefore highly desirable to enable a microjoining structure to interconnect several chips on to a system-on-a-package carrier to achieve significantly higher input/output density between the chips as compared to the current state-of-the-art.

Concomitantly, a particular need has arisen for temporarily—rather than permanently—interconnecting a collection of devices such as chips involving a high density array of the aforesaid microjoints for the specific purpose of first performing a system-level test and then for performing a "burn in." This enables one to sort out and combine the good quality chips on to the carrier to form a functional and reliable system on a package.

SUMMARY OF THE INVENTION

A general object of the present invention is to furnish the ability to test and "burn in" device chips that require ultra high pitch I/O pads (down to approximately 2.5 $\mu$m on 5 $\mu$m centers).

Another object of the present invention is to realize the ability to test devices that are to be tested and burned in as a part of a collection of devices that form a functional system.

The ability to do all of the above is achieved without forming a permanent metallurgical joint to the devices. This eliminates the need to apply forces to the microjoints to remove bad chips from the test substrate, which is particularly important for these very small sized joint structures.

The test carrier of this invention is reusable for many test cycles since no permanent bonds are formed with the parts that are tested on it. A sorting of the devices that have been tested is carried out based on their level of performance under the test conditions, and particularly is based on a suitable metric (e.g. device speed at the system level).

In fulfillment of the above stated objects, and the particular need noted that has arisen in this art, the present invention, briefly stated, provides a structure comprising a system level test and burn in carrier, said structure comprising: a system for testing an array of device chips by temporarily attaching a microjoint structure, comprising a carrier, to the array, the carrier being a multilayer substrate having a plurality of receptacles provided with dendritic surface features, said receptacles matching a pattern and size of microjoint pads on the device chips; test pads; interconnect wiring that connects the test pads to the dendritic receptacle array, and interconnect wiring additionally providing connections between a multiplicity of the devices mounted on the carrier so as to form a complex functional system that can be adequately tested while on the carrier.

In accordance with the process of the present invention, the device chips to be tested and burned in are provided with microjoint connection metallurgies according to related dockets YOR . . . 0216 and YOR . . . 0217. Then with application of a conformal pressure the device pads are pushed against the dendritic contacts on the carrier so as to establish a reliable temporary electrical connection for the duration and conditions of a typical test and burn in process. At the end of this regimen, any bad quality chips are removed and replaced with new chips. The regimen iteratively leads to a final collection of chips deemed to be functional at a system level with a good degree of reliability.

The foregoing and still further objects and advantages of the present invention will be more apparent from the following detailed explanation of the preferred embodiments of the invention in connection with the accompanying drawing.

DESCRIPTION OF PREFERRED EMBODIMENT

It will become apparent as description of the invention proceeds that because the aforenoted objects are fulfilled there is an ability, according to the invention, to test devices that have to be tested and "burned in" as a part of a collection of devices that form a functional system (e.g., electro/optical system, network switching systems, a multiprocessor parallel computing systems) thereby to ensure system level operability and performance. Consequently, this allows a selection of a group of chips that are known to be good as a group; alternately, the method of the invention allows a sorting of a particular part or chip that is prone to low yield or varying levels of performance by testing a number of chips mounted on the test carrier 10 along with a known good collection of other chips that make up the full system. When the testing is completed the temporarily attached device chips can be separated from the test carrier.

It will be understood that when one begins the fabrication method in accordance with the present invention, one starts with the carrier component 10 constituted of the material 12, such as silicon, ceramic or organic carrier, with the interchip wiring 16. Wiring of contacts to connect to external electronics must be carried out. The wiring will have multiple levels and the carrier will also have vias, not shown on FIG. 1, but extending through the carrier 10 to allow for connections to the back of the carrier.

Figure 1:
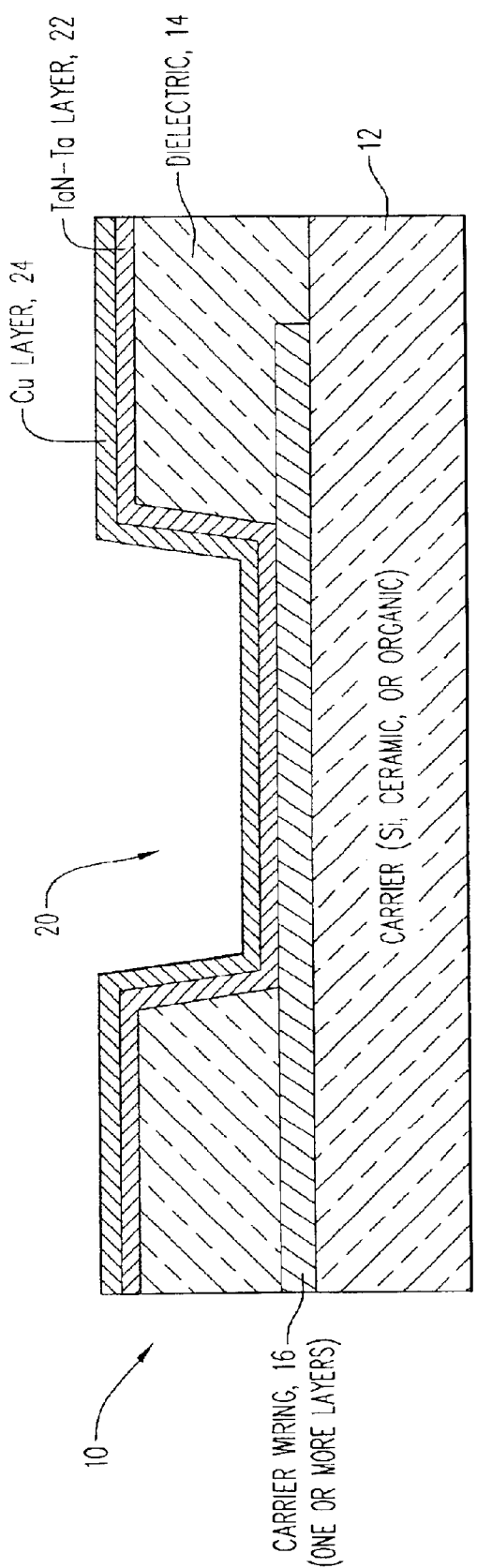
FIG. 1 illustrates a carrier with metal depositions over a contact receptacle that was formed in an earlier deposited dielectric film.
Figure 2:
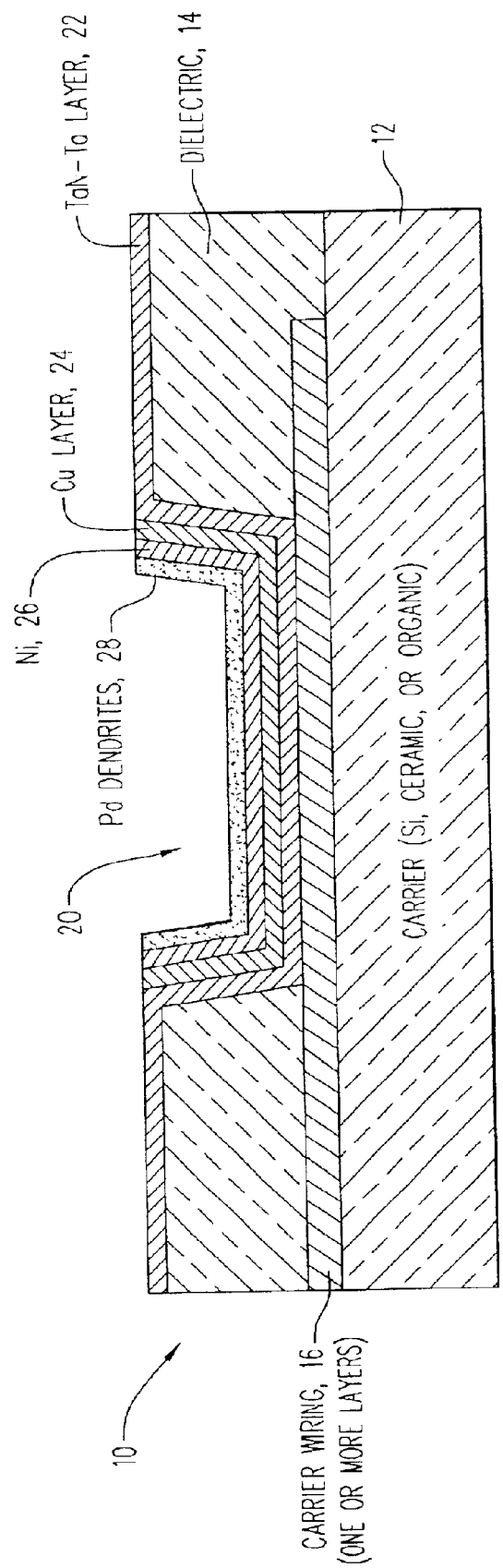
FIG. 2 shows the carrier after removal of the metal, in the form of copper, from the surface by chemical mechanical polishing (CMP) and deposition of a nickel layer and Pd dendrites.
Figure 3:
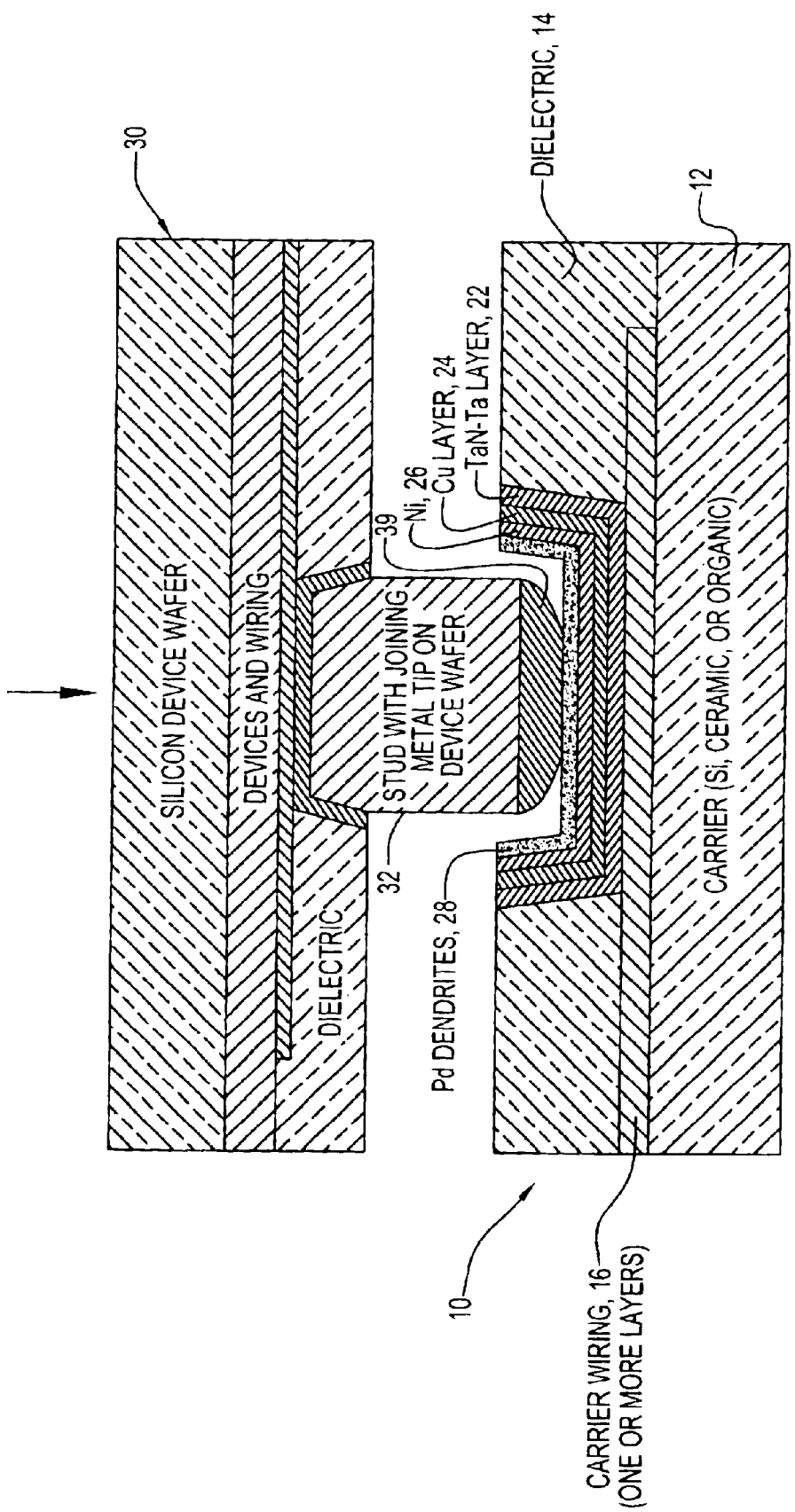
FIG. 3 depicts the carrier after etching of the TaN—Ta layer above the dielectric, and showing temporary joining of a stud extending from a device chip.

It will be seen that the representative receptacle 20, as seen in FIG. 1, extends into the dielectric layer 14 where contacts to the device chips are made with respect to a representative device wafer 30 with a representative stud 32 extending from it and having a metal tip 39 (FIG. 3). The important point to note is that the size of the receptacles 20 can be as small as about 2.5 microns. The size of the receptacle, additionally, is about 20% larger than the size of the stud 32.

It will further be seen in FIG. 1 that a liner layer 22 is deposited, which is usually constituted of 0.04 micron layers of TaN-Ta and that a seed layer 24 is constituted of a 0.1 micron of Cu.

After the layers 22 and 24 have been deposited the copper layer is polished off by the use of chemical mechanical polishing (CMP) from the top surface stopping on the layer 22 of TaN—Ta. Cu is left in the bottom of the contact receptacles and on their sidewalls.

The next step in the method is the electroplating of a 0.5 micron layer 26 of a barrier such as nickel into the contact openings, using a process that plates only on Cu. The TaN—Ta serves to bring in the current, but no plating takes place there.

Next, a three-step technique is used to electroplate a base strike layer of Pd, a dentritic layer of Pd and a reinforcing over-layer of Pd. All of these Pd layers are designated 28. Different plating solution concentrations, current densities, and/or ultrasonic agitation levels will be used to achieve the dendritic Pd triple layer. Optionally, the dendrites can be made of a non-noble metal such as Ni or Cu and plated over with a noble metal such as Pd, Pt or Rh.

Etching is now performed to remove the top, planar portion of the TaN-Ta layer 22 from the region between the receptacles, the reason for doing so being understood by reference to FIG. 3. Chemical or dry plasma etching can be used for this step. The finished carrier structure 10 (FIG. 3) now has female receptacles 20 populated with noble metal asperities that will engage and penetrate into the softer microjoint solder or Au-Sn tipped pads 39 on the device chip studs 32 when the test carrier and the chip 30 are aligned and assembled together under a conformal back pressure assembly not shown in FIG. 3. This contact behavior is adequate for exercising or performing system-level test and for burning in of the whole system, collectively made up of the individual chips. The tests performed under the temporary interconnection regime are not restricted to open/short-testing or to system performance test, but can include an exhaustive routine of testing to make sure the chips are good for their intended uses.

The invention having been thus described with particular reference to the preferred forms thereof, it will be obvious that various changes and modifications may be made therein without departing from the spirit and scope of the invention as defined in the appended claims.

What is claimed is:

1. A system for testing a collection of device chips by temporarily attaching a microjoint structure to the array comprising:

the microjoint function carrier having a multilayer substrate with a plurality of receptacles in its top surface;

a set of dendritic features disposed in said receptacles;

a set of contact pads on the device chips that match the plurality of receptacles in the carrier;

a set of test pads on the carrier, and interconnect wiring that connects the test pads to the dendritic pad array.

2. A system as defined in claim 1, wherein the contact pads on the device chips are shaped to have studs extending from the respective pad surfaces.

3. A system as defined in claim 1, wherein the receptacles have contiguous layers of liner, seed and barrier at their interior walls and bases, in addition to noble metal dendrites at the innermost portions of these surfaces.

4. A system as in claim 3 wherein the liner layer is selected from the group consisting of Ta, Ti, W, TaN, TiN, WN, Cr, with a thickness of 200–1600A.

5. A system as in claim 3 wherein the seed layer is selected from the group consisting of Cu, Au, with a thickness of 300–2000A.

6. A system as in claim 3 wherein the barrier layer is selected from the group consisting of Ni, Ni-P, Co, Co-P, Ni-P, Pt, Pd, with a thickness of 2000–10,000A.

7. A system as defined in claim 1, wherein the carrier includes a layer of silicon and a dielectric layer, the receptacles being in the dielectric layer, and carrier wiring being beneath the dielectric layer.

8. A system as defined in claim 4, wherein the liner layer is etched away from the top surface of the dielectric layer.

9. A system as defined in claim 5, wherein the seed layer is etched away from the top surface of the dielectric layer.

10. A system as in claim 1 wherein said dendrites are made of a noble metal selected from the group comprising Pt, Pd, Rh.

11. A system as in claim 6 wherein the metal of dendrites is selected from non-noble metals such as Ni, Cu, and subsequently plated over with a noble metal such as Pt, Pd, Rh.

12. A process for testing an array of device chips in a semiconductor wafer by temporarily attaching a microjoint structure to the array comprising:

forming the microjoint structure by building a carrier in the form of a multilayer substrate and having a plurality of receptacles on the carrier;

forming a set of contact pads on the device chips;

forming a set of dendritic pad arrays on a carrier, matching the contact pads on the device chips;

forming interconnect wiring on the carrier that connects the contact pads to the dendritic pad array;

assembling the chips to temporarily engage contact pads on the chip against matching dendritic pads on the carrier to make temporary contact, and performing system level functional tests and burn-in on the entire collection of chips.

13. A process as defined in claim 12 including a step of forming contact pads at the ends of studs extending from the semiconductor wafer.

14. A process as defined in claim 12 including a step of forming contiguous layers of liner, seed, barrier metal and noble metal dendritic layers at the peripheries of the receptacle in the top surface of the carrier.

15. A process as defined in claim 14 wherein the liner layer is selected from the group consisting of Ta, Ti, W, TaN, TiN, WN, Cr, with a thickness of 200–1600A.

16. A process as defined in claim 14 wherein the seed layer is selected from the group consisting of Cu, Au, with a thickness of 300–2000A.

17. A process as defined in claim 14 wherein the barrier layer is selected from the group consisting of Ni, Ni-P, Co, Co-P, Ni-P, Pt, Pd, with a thickness of 2000–1000A.

18. A process as defined in claim 14, wherein the carrier includes a layer of silicon and a dielectric layer, the receptacles being in the dielectric layer, and carrier wiring is below the dielectric layer.

19. A process as defined in claim 18, including the step of etching away the liner layer from the top surface of the tantalum layer.

20. A process in accordance with claim 18, including the step of etching away the seed away from the top surface of the dielectric layer.

21. A process as defined in claim 14 wherein the noble metal constituting the dendrites is selected from the group comprising Pt, Pd, Rh.

22. A process as defined in claim 14 wherein the metal constituting the dendrites is selected from the group comprising Ni, Cu, and subsequently plated over by a layer of noble metal such as Pt, Pd, Rh.

* * * * *